US012580584B2

(12) United States Patent
Mizutani et al.

(10) Patent No.: US 12,580,584 B2
(45) Date of Patent: Mar. 17, 2026

(54) DELTA SIGMA MODULATION CIRCUIT, DIGITAL TRANSMISSION CIRCUIT, AND DIGITAL TRANSMITTER

(71) Applicant: MITSUBISHI ELECTRIC CORPORATION, Tokyo (JP)

(72) Inventors: Hiroyuki Mizutani, Tokyo (JP); Tatsuya Hagiwara, Tokyo (JP); Michiya Hayama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 41 days.

(21) Appl. No.: 18/904,166

(22) Filed: Oct. 2, 2024

(65) Prior Publication Data

US 2025/0030437 A1     Jan. 23, 2025

Related U.S. Application Data

(63) Continuation of application No. PCT/JP2022/020903, filed on May 20, 2022.

(51) Int. Cl.
    *H03M 3/00* (2006.01)
    *H04B 1/04* (2006.01)
(52) U.S. Cl.
    CPC .......... *H03M 3/352* (2013.01); *H03M 3/412* (2013.01); *H03M 3/436* (2013.01); *H04B 1/04* (2013.01)
(58) Field of Classification Search
    CPC ...... H03M 3/352; H03M 3/412; H03M 3/436; H04B 1/04
    See application file for complete search history.

(56) References Cited

U.S. PATENT DOCUMENTS

| | | | |
|---|---|---|---|
| 7,508,330 B1 * | 3/2009 | Chandra | H03M 1/0663 |
| | | | 341/143 |
| 9,077,369 B1 * | 7/2015 | Tsang | H03M 3/338 |
| 10,581,453 B1 * | 3/2020 | Ganta | H03M 3/454 |
| 10,778,244 B2 * | 9/2020 | Chen | H03M 3/322 |
| 2019/0245553 A1 * | 8/2019 | Bolatkale | H03M 3/424 |
| 2021/0126648 A1 * | 4/2021 | Zhang | H03M 1/1061 |

FOREIGN PATENT DOCUMENTS

| | | |
|---|---|---|
| EP | 2 506 426 A1 | 10/2012 |
| WO | WO 2017/085789 A1 | 5/2017 |
| WO | WO 2019/190621 A1 | 10/2019 |

OTHER PUBLICATIONS

International Search Report (PCT/ISA/210) issued in PCT/JP2022/020903, dated Aug. 9, 2022.

* cited by examiner

*Primary Examiner* — Freshteh N Aghdam
(74) *Attorney, Agent, or Firm* — Birch, Stewart, Kolasch & Birch, LLP

(57)     ABSTRACT

Disclosed is a circuit including: a loop filter to perform digital processing on a signal inputted from an outside; multiple quantizers to output 1-bit signals corresponding to magnitude relationships with thresholds on the basis of the signal after the digital processing by the loop filter; and an averaging circuit to calculate the average of the values shown by the signals outputted by the quantizers, and to feed back the average to the loop filter, in which the thresholds used by the quantizers differ from one another.

7 Claims, 10 Drawing Sheets

DELTA SIGMA MODULATION CIRCUIT, DIGITAL TRANSMISSION CIRCUIT, AND DIGITAL TRANSMITTER

CROSS REFERENCE TO RELATED APPLICATION

This application is a Continuation of PCT International Application No. PCT/JP2022/020903, filed on May 20, 2022, which is hereby expressly incorporated by reference into the present application.

TECHNICAL FIELD

The present disclosure relates to a delta sigma modulation circuit which is mounted in a digital circuit, a digital transmission circuit, and a digital transmitter.

BACKGROUND ART

In conventional transmitters, a digital circuit, such as a modem, generates a signal which is a transmission object, and an analog circuit converts the signal which is a transmission object into a signal in a high frequency band, and transmits this signal. The signal generated by the digital circuit lies in a baseband frequency band. On the other hand, in recent years, a speedup of field programmable gate arrays (FPGAs) has been progressing. Therefore, development of a digital transmitter which outputs a signal which is a transmission object, in a high frequency band, directly from an FPGA has been made.

In digital transmitters, an analog circuit for converting a signal in a baseband frequency band into a signal in a high frequency band is unnecessary. Therefore, the circuit configuration of this digital transmitter can be simplified compared to conventional transmitters.

Further, it is expected that as a further speedup of FPGAs advances in the future, digital transmitters in a high frequency band such as a millimeter wave band can also be implemented by a simple circuit configuration.

An example of the configuration of a conventional digital transmitter is shown in FIG. 11.

The conventional digital transmitter includes, for example, an FPGA (digital circuit) 11, an amplifier 12, a filter 13, and an antenna 14, as shown in FIG. 11. In the digital transmitter shown in FIG. 11, because a signal which is a transmission object is outputted, in a high frequency band, directly from the FPGA 11, a delta sigma modulation circuit 1102 is mounted in the FPGA 11.

This delta sigma modulation circuit 1102 converts a signal generated by a modem 1101 into a 1-bit signal which can be outputted from the FPGA 11 and which is expressed by High and Low, and outputs the 1-bit signal.

The power of the 1-bit signal outputted from the FPGA 11 is amplified by the amplifier 12 and higher harmonics occurring in the amplifier 12 are removed from the 1-bit signal by the filter 13, and, after that, the 1-bit signal is transmitted as an electric wave from the antenna 14.

In the delta sigma modulation circuit 1102 mounted in the FPGA 11, quantization is performed on the signal which is a transmission object by the quantizer 1103 in order to convert the signal into a 1-bit signal.

On the other hand, this quantization causes an error (quantization error) to occur between the signal which is a transmission object and the 1-bit signal. Therefore, seeing the spectrum of the 1-bit signal after delta sigma modulation, it is understood that the quantization error becomes a quantization noise and this quantization noise appears in a band in the vicinity of that of the main signal.

This quantization noise becomes a factor causing a decrease in the signal to noise ratio (referred to as SNR hereinafter) of the signal to be transmitted from the digital transmitter, and a decrease in the communication quality. Therefore, in the digital transmitter, an improvement in the SNR of the transmission signal is an issue.

On the other hand, the configuration of a digital transmitter aimed at achieving an improvement in the SNR is shown in Patent Literature 1.

In this Patent Literature 1, a configuration in which multiple delta sigma modulation circuits are disposed in parallel inside a digital circuit which includes an FPGA, and a combining circuit combines signals outputted by these multiple delta sigma modulation circuits is shown.

In this configuration, by then making initial values preset to the delta sigma modulation circuits be different from one another, the delta sigma modulation circuits can be made to generate signals in such a way that quantization noises differ from one another, without changing the main signals out of the signals outputted by the delta sigma modulation circuits. Therefore, in this configuration, when the signals outputted by the multiple delta sigma modulation circuits are combined by the combining circuit, the levels of the quantization noises to the main signals decrease relatively, and, as a result, the SNR can be improved.

CITATION LIST

Patent Literature

Patent Literature 1: WO No. 2017/085789

SUMMARY OF INVENTION

Technical Problem

As shown in FIG. 11, a delta sigma modulation circuit 1102 includes a quantizer 1103 and a loop filter 1104 when it is divided roughly.

The quantizer 1103 shown in FIG. 11 compares the value shown by a signal outputted by the loop filter 1104 and a threshold preset to the quantizer 1103, and outputs a 1-bit signal corresponding to a magnitude relationship between the two values.

The loop filter 1104 is a digital filter that performs digital processing which exerts an influence on the stability of the delta sigma modulation circuit 1102, how a quantization noise appears, or the like.

The initial value explained above of the delta sigma modulation circuit 1102 is set to the loop filter 1104. Therefore, in Patent Literature 1, the SNR is improved by disposing delta sigma modulation circuits of this type in parallel.

However, in a delta sigma modulation circuit mounted in a digital circuit such as an FPGA, a loop filter is larger than a quantizer from the view point of the circuit scales of digital circuits. Therefore, the circuit scale of the digital circuit increases greatly as delta sigma modulation circuits are disposed in parallel.

The present disclosure is made in order to solve the above-mentioned problem, and it is therefore an object of the present disclosure to provide a delta sigma modulation circuit that can generate multiple signals which make it possible to reduce a quantization noise relative to a main signal, with a single configuration.

Solution to Problem

A delta sigma modulation circuit according to the present disclosure includes: a loop filter to perform digital processing on a signal inputted from an outside; multiple quantizers to output 1-bit signals corresponding to magnitude relationships with thresholds on a basis of the signal after the digital processing by the loop filter; and an averaging circuit to calculate an average of the signals respectively outputted by the quantizers, and to feed back the average to the loop filter, wherein the thresholds used by the quantizers differ from one another.

Advantageous Effects of Invention

According to the present disclosure, because the configuration is provided as above, it is possible to generate multiple signals which make it possible to reduce a quantization noise relative to a main signal, with the single configuration.

BRIEF DESCRIPTION OF DRAWINGS

FIG. 1 is a diagram showing an example of the configuration of a digital transmitter according to Embodiment 1;

FIG. 5 is a diagram showing another example of the configuration of the digital transmitter according to Embodiment 1;

FIG. 6 is a diagram showing another example of the configuration of the digital transmitter according to Embodiment 1;

FIG. 8 is a diagram showing another example of the configuration of the digital transmitter according to Embodiment 1;

FIG. 10 is a diagram showing an example of the configuration of a digital transmitter according to Embodiment 3.

DESCRIPTION OF EMBODIMENTS

Hereinafter, embodiments of the present disclosure will be explained in detail with reference to the drawings.

Embodiment 1

Figure 1:
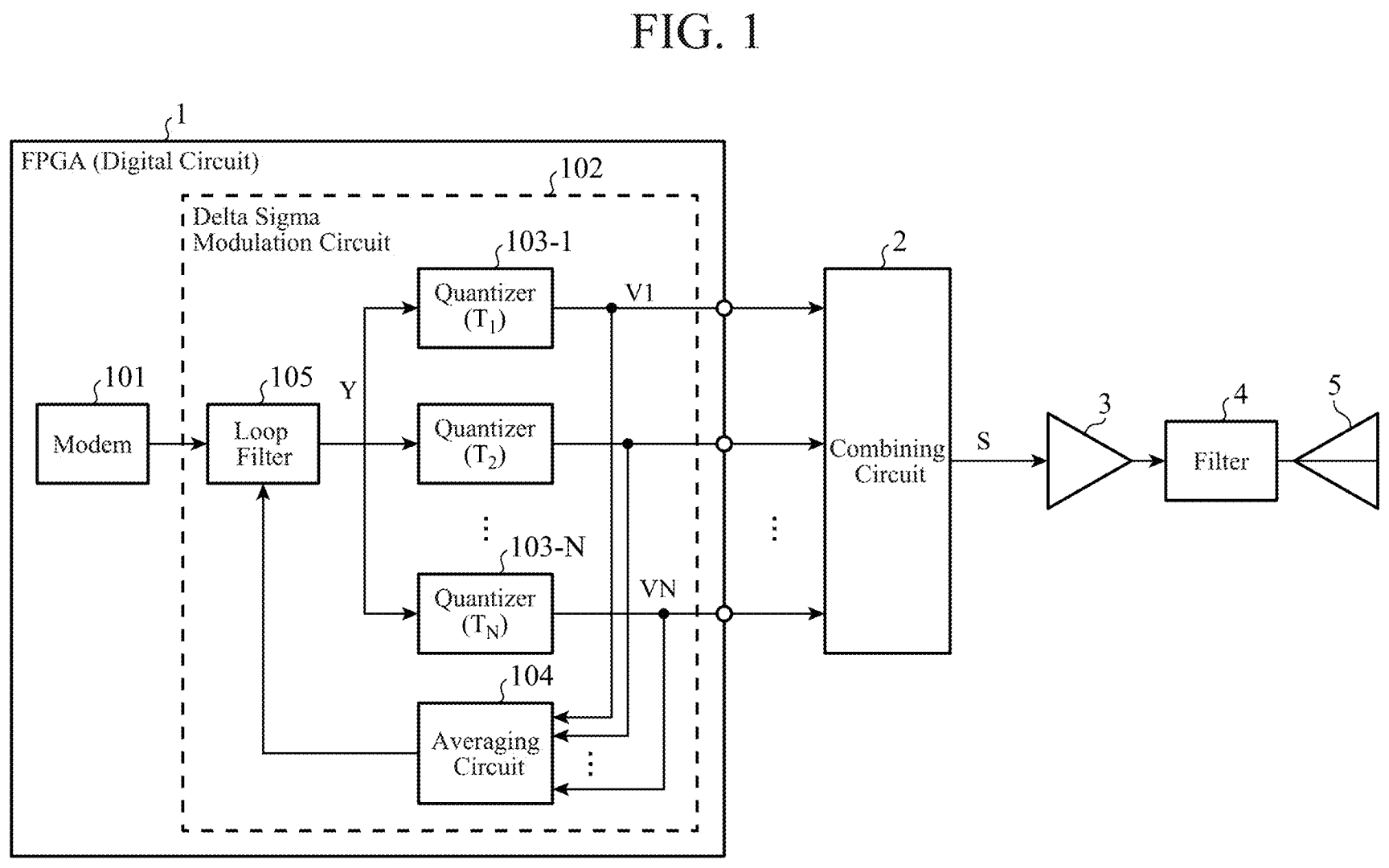

FIG. 1 is a diagram showing an example of the configuration of a digital transmitter according to Embodiment 1.

The digital transmitter according to Embodiment 1 includes an FPGA (digital circuit) 1, a combining circuit 2, an amplifier 3, a filter 4, and an antenna 5, as shown in FIG. 1. The FPGA 1 and the combining circuit 2 make up a digital transmission circuit.

The FPGA 1 outputs multiple 1-bit signals which are based on a signal which is a transmission object to the combining circuit 2.

An example of the configuration of this FPGA 1 will be mentioned later.

The combining circuit 2 combines the amplitudes of the multiple 1-bit signals outputted by the FPGA 1. A signal after the combining by this combining circuit 2 is outputted to the amplifier 3.

As this combining circuit 2, a combining circuit which includes an analog passive circuit is used. The combining circuit which includes an analog passive circuit is configured using, for example, a resistor, a capacitor, an inductor, a transmission line, or the like.

Figure 2:
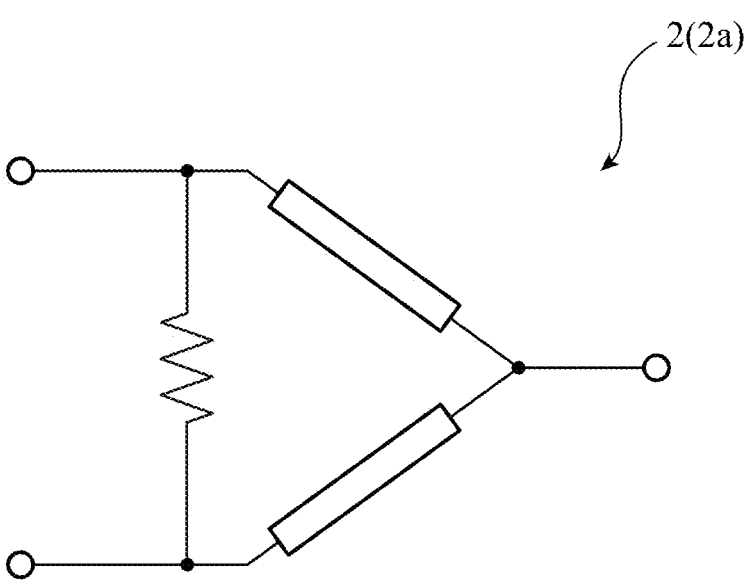
FIG. 2 is a diagram showing an example of the configuration of a combining circuit in Embodiment 1.

An example of the configuration of the combining circuit 2 in Embodiment 1 is shown in FIG. 2.

In FIG. 2, a configuration example in the case where a Wilkinson combiner is used as the combining circuit 2 is shown. The Wilkinson combiner shown in this FIG. 2A is a combining circuit which includes two transmission lines and a single resistor, and is an in-phase combining circuit 2a.

Then, the digital transmitter shown in FIG. 1 has a configuration in which it is assumed that the combining circuit 2 is the in-phase combining circuit 2a.

The amplifier 3 amplifies the power of the signal after the combining by the combining circuit 2. The signal after the amplification by this amplifier 3 is outputted to the filter 4.

As this amplifier 3, an amplifier which employs a semiconductor, such as a CMOS for which high-frequency applications have been progressing in recent years, is used, for example.

The filter 4 removes higher harmonics included in the signal after the amplification by the amplifier 3. The signal after the removal of higher harmonics by this filter 4 is outputted to the antenna 5.

As this filter 4, a low pass filter is used, for example.

This filter 4 is not a component indispensable to the digital transmitter.

The antenna 5 emits the signal after the removal of higher harmonics by the filter 4, as an electric wave, into space.

As this antenna 5, a patch antenna is used, for example.

Next, an example of the configuration of the FPGA 1 in Embodiment 1 will be explained.

The FPGA 1 in Embodiment 1 includes a modem 101 and a delta sigma modulation circuit 102, as shown in FIG. 1.

The modem 101 generates a signal which is a transmission object. At this time, the modem 101 generates a signal which is a transmission object by, for example, modulating communication data to generate a digital modulation signal. The signal generated by this modem 101 is outputted to the delta sigma modulation circuit 102.

The delta sigma modulation circuit 102 converts the signal generated by the modem 101, by means of delta sigma modulation, into multiple 1-bit signals which can be outputted from the FPGA 1 and each of which is expressed by High and Low. The signals after the conversion by this delta sigma modulation circuit 102 are outputted to the combining circuit 2.

This delta sigma modulation circuit 102 has multiple quantizers 103-1 to 103-N, an averaging circuit 104, and a loop filter 105, as shown in FIG. 1.

Each of the quantizers 103-1 to 103-N converts the signal after digital processing by the loop filter 105 into a 1-bit signal. Each of the signals after the conversion by these quantizers 103-1 to 103-N is outputted to the averaging circuit 104 and the combining circuit 2.

More concretely, each of the quantizers 103-1 to 103-N compares a preset threshold and the value shown by the signal after the digital processing by the loop filter 105, and outputs a 1-bit signal corresponding to a magnitude relationship between them.

For example, each of the quantizers 103-1 to 103-N outputs a signal showing 1 when the value shown by the signal after the above-mentioned digital processing is greater than or equal to the threshold, or outputs a signal showing 0 when the value shown by the signal after the above-mentioned digital processing is less than the threshold.

The thresholds used by the quantizers 103-1 to 103-N differ from one another. For example, the thresholds used by the quantizers 103-1 to 103-N may be set to equally spaced values.

On the basis of the 1-bit signals outputted by the quantizers 103-1 to 103-N, the averaging circuit 104 calculates the average of the values shown by these signals. A signal showing the average calculated by this averaging circuit 104 is fed back to the loop filter 105.

The loop filter 105 performs the digital processing on the basis of the signal generated by the modem 101 and the signal showing the average calculated by the averaging circuit 104. This loop filter 105 is a digital filter which performs the digital processing which exerts an influence on the stability of the delta sigma modulation circuit 102, how a quantization noise appears, or the like. The signal after the digital processing by this loop filter 105 is outputted to the quantizers 103-1 to 103-N.

Figure 3:
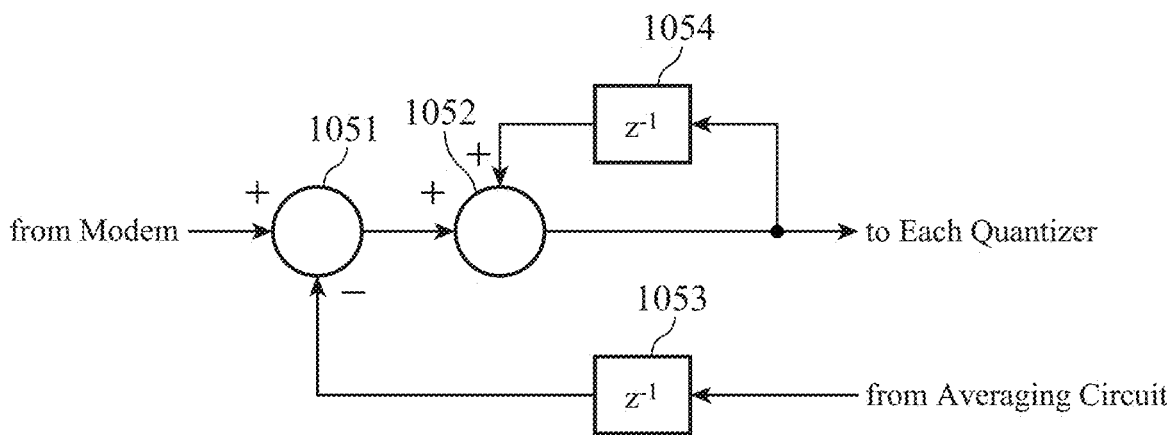
FIG. 3 is a diagram showing an example of the configuration of a loop filter in Embodiment 1.

This loop filter 105 has, for example, an adder 1051, an adder 1052, a delay unit 1053, and a delay unit 1054, as shown in FIG. 3. The loop filter 105 shown in FIG. 3 is a first-order one. Further, the loop filter 105 shown in FIG. 3 is the same as the loop filter 1104 shown in FIG. 11.

The adder 1051 subtracts the signal after the delay by the delay unit 1053 from the signal generated by the modem 101. The signal after the subtraction by this adder 1051 is outputted to the adder 1052.

The adder 1052 adds the signal after the delay by the delay unit 1054 to the signal after the subtraction by the adder 1051. The signal after the addition by this adder 1052 is outputted to the quantizers 103-1 to 103-N and the delay unit 1054.

The delay unit 1053 delays the signal showing the average calculated by the averaging circuit 104 by one clock. The signal after the delay by this delay unit 1053 is outputted to the adder 1051.

The delay unit 1054 delays the signal after the addition by the adder 1052 by one clock. The signal after the delay by this delay unit 1054 is outputted to the adder 1052.

In this way, in the first-order loop filter shown in FIG. 3, the adder 1051 calculates the difference between the signal generated by the modem 101 and the signal which the delay unit 1053 outputs by delaying the output of the averaging circuit 104 by one clock, and the adder 1052 and the delay unit 1054 perform addition on the signal showing the difference.

Next, an example of the operation of the digital transmitter according to Embodiment 1 shown in FIG. 1 will be explained.

Figure 11:
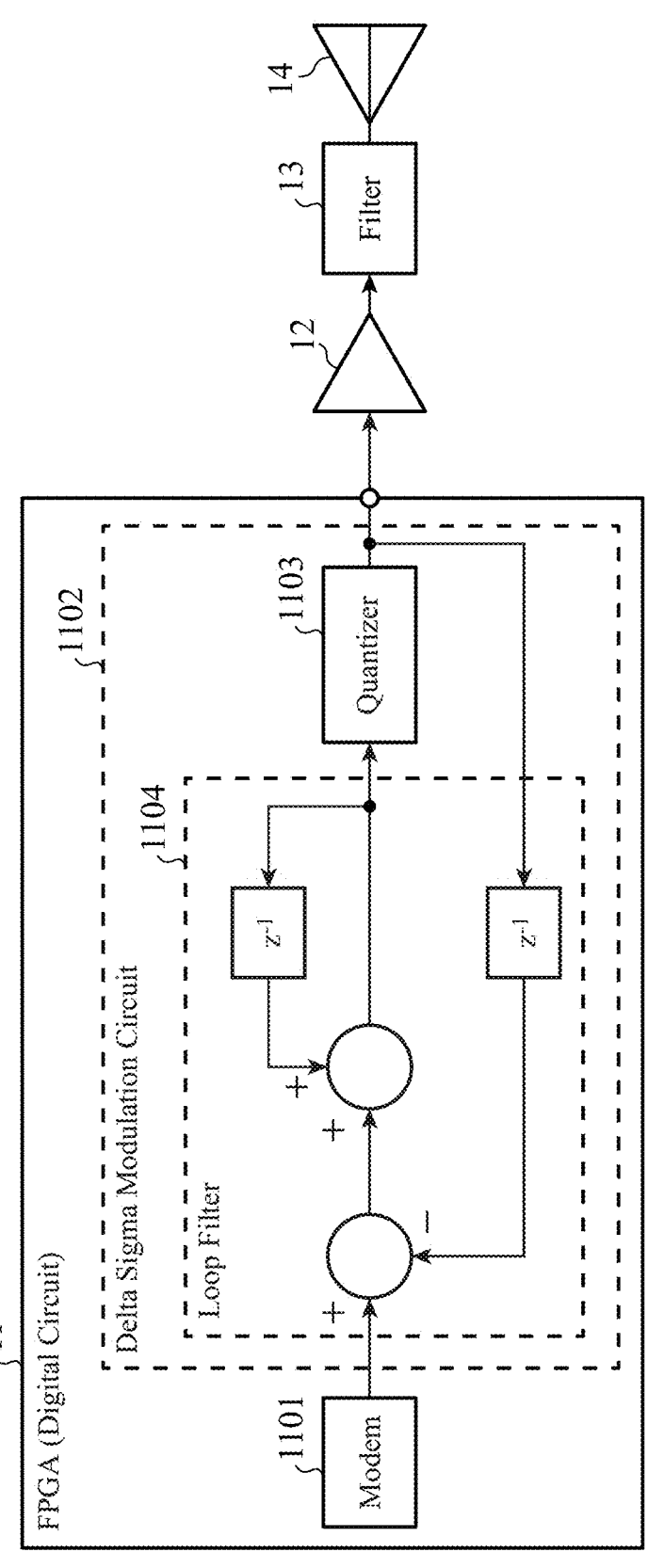
FIG. 11 is a diagram showing an example of the configuration of a conventional digital transmitter.

Here, it is seen from a comparison between the FPGA 1 in Embodiment 1 shown in FIG. 1 and the conventional FPGA 11 shown in FIG. 11 that the FPGA 1 in Embodiment 1 differs from the conventional FPGA 11 in that the quantizer 1103 shown in FIG. 11 is replaced by the multiple quantizers 103-1 to 103-N and the averaging circuit 104 in FIG. 1. Further, the FPGA 1 in Embodiment 1 differs from the conventional FPGA 11 in that in FIG. 11, the number of outputs of the delta sigma modulation circuit 1102 is 1, whereas in FIG. 1, the number of outputs of the delta sigma modulation circuit 102 is N equal to the number of quantizers 103-1 to 103-N.

Then, in the digital transmitter according to Embodiment 1 shown in FIG. 1, when the signal generated by the modem 101 is inputted to the loop filter 105, the digital processing is performed on between the signal and the output of the averaging circuit 104, and a result is outputted to the quantizers 103-1 to 103-N. Within the loop filter 105, the adder 1051 calculates the difference between the signal generated by the modem 101 and the signal which the delay unit 1053 outputs by delaying the output of the averaging circuit 104 by one clock, and the adder 1052 and the delay unit 1054 perform addition on the signal showing the difference.

Further, the thresholds ($T_1$ to $T_N$) different from one another are set, respectively, to the quantizers 103-1 to 103-N. Then, these quantizers 103-1 to 103-N output 1-bit signals which they acquire from the signal from the loop filter 105, respectively, on the basis of the thresholds ($T_1$ to $T_N$).

The 1-bit signals outputted from the quantizers 103-1 to 103-N are then inputted to the averaging circuit 104 and the average of the values shown by the signals is calculated by the averaging circuit 104, and, after that, the average is fed back to the loop filter 105.

Then, the delta sigma modulation circuit 102 repeatedly performs the above-mentioned operation.

Each of the 1-bit signals outputted from the quantizers 103-1 to 103-N is expressed by High and Low, and the amplitudes of the 1-bit signals are combined by the combining circuit 2.

Here, each relationship, in a case where the input signal common to the quantizers 103-1 to 103-N is denoted by Y, the output signal of each of the quantizers 103-1 to 103-N is denoted by Vk (k is an integer ranging from 1 to N), and the output signal of the combining circuit 2 is denoted by S, will be explained using FIG. 4. In FIG. 4, for the sake of simplicity, the case of N=3 is explained.

Figure 4A:
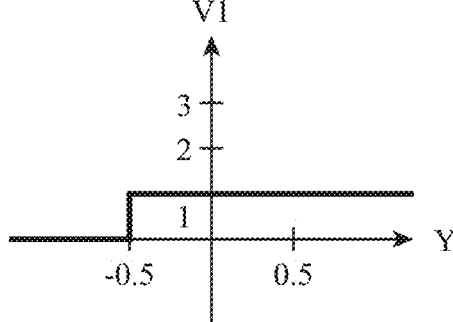
FIGS. 4A to 4D are graphs showing an example of the operation of circuitry which is a combination of multiple quantizers and a combining circuit in Embodiment 1.

For example, it is assumed that the threshold ($T_1$) of the quantizer 103-1 is $T_1=-0.5$. In this case, a signal showing V1=0 is outputted from the quantizer 103-1 when Y<−0.5, or a signal showing V1=1 is outputted from the quantizer 103-1 when Y>=−0.5, as shown in FIG. 4A.

Figure 4B:
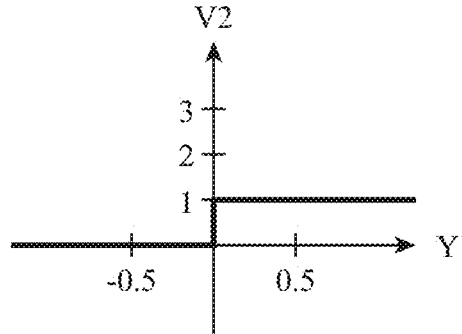
Figure 4C:
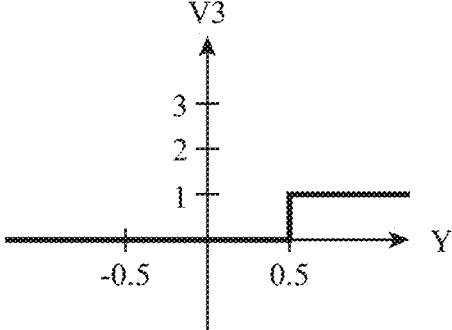

Further, the threshold ($T_2$) of the quantizer 103-2 and the threshold ($T_3$) of the quantizer 103-3 are set to values different from $T_1$. For example, it is assumed that the spacings between the thresholds are equal, and $T_2=0$ and $T_3=0.5$. In this case, V2 and V3 which are the output signals from the quantizers 103-2 and 103-3 are as shown in FIGS. 4B and 4C, respectively.

Then, when V1 which is the output signal of the quantizer 103-1 is outputted to the combining circuit 2, and V1=1, a voltage corresponding to High is outputted. In contrast, when V1=0, a voltage corresponding to Low is outputted. Here, for the sake of simplicity, it is assumed that High=1 and Low=0. The same goes for the quantizers 103-2 and 103-3.

Figure 4D:
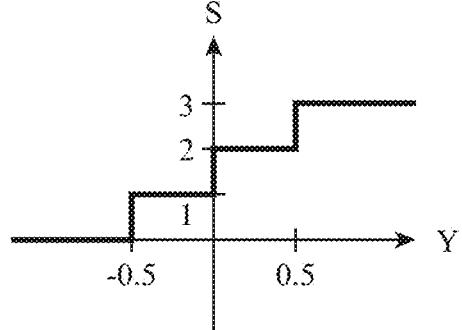

Then, as a result of combining the amplitudes of the three 1-bit signals outputted from the FPGA 1, in the combining circuit 2, a stair-like output signal(S) as shown in FIG. 4D is outputted.

Here, a quantization noise which appears in each of the 1-bit signals outputted from the FPGA 1 is caused by a quantization error occurring between the signal which is a transmission object and the 1-bit signal outputted from the corresponding one of the quantizers 103-1 to 103-N, and this quantization error is large in the case of 1 bit.

Because only 1-bit signals can be outputted from the FPGA 1, the quantizers 103-1 to 103-N includes 1-bit quantizers, and, as a result, it is seen from the spectrum of each of the 1-bit signals outputted from the FPGA 1 that a quantization noise with a high level appears in the vicinity of a main signal, and there occurs a state in which the SNR is low. Therefore, in the digital transmitter according to Embodiment 1, an output which includes multiple steps is acquired by combining the 1-bit signals in the combining circuit 2.

In the example of N=3, an output in which the number of steps is 3 is acquired. In this case, the quantization error occurring between the signal which is a transmission object and a signal outputted from the combining circuit 2 is small compared with that in the configuration of FIG. 11 which corresponds to the case in which the number of steps is 1. Therefore, the spectrum of the signal outputted from the combining circuit 2 has a quantization noise whose level is low relatively to that of the main signal, and the SNR is improved. Although the case of N=3 is explained above, the SNR of the transmission signal is improved as the number of steps, i.e. N which is the number of quantizers 103-1 to 103-N whose thresholds differ from one another increases.

After that, the power of the signal after the combining by the combining circuit 2 is amplified by the amplifier 3, and the higher harmonics occurring in the amplifier 3 are removed from the signal by the filter 4, and, after that, the signal is transmitted as an electric wave from the antenna 5.

As mentioned above, in the digital transmitter according to Embodiment 1, the delta sigma modulation circuit 102 is configured using the single loop filter 105 for the multiple quantizers 103-1 to 103-N whose thresholds differ from one another, and the combining circuit 2 combines the amplitudes of the multiple 1-bit signals outputted from the FPGA 1 in which the delta sigma modulation circuit 102 is mounted. As a result, in the digital transmitter according to Embodiment 1, it is possible to improve the SNR while reducing the circuit scale of the digital circuit, as compared with the configuration in which delta sigma modulation circuits are disposed in parallel, as shown in Patent Literature 1.

Further, in a digital transmitter, the use of an amplifier with a low gain as the amplifier of the digital transmitter leads a downsizing and a cost reduction. Then, in order to cause a transmission signal to have the power which is needed to transmit the transmission signal from an antenna while using an amplifier with a low gain, it is necessary to increase the power of a signal to be inputted to the amplifier in advance.

On the other hand, in the digital transmitter according to Embodiment 1, a combining circuit which includes an analog passive circuit such as a Wilkinson combiner shown in FIG. 2 is used as the combining circuit 2. As a result, in the digital transmitter according to Embodiment 1, it is possible to increase the signal amplitude without low-voltage-operation constraints on semiconductors, the constraints being caused by high-frequency applications of semiconductors. As a result, in the digital transmitter according to Embodiment 1, the power needed in order to transmit a signal from the antenna 5 can be acquired without increasing the gain of the amplifier 3 which is a stage following the combining circuit 2, and a downsizing and a cost reduction of the digital transmitter can be achieved.

In FIG. 1, the configuration in which the amplifier 3 is connected as a stage following the combining circuit 2 is shown.

As explained until now, in the digital transmitter according to Embodiment 1, the signals outputted from the FPGA 1 shown in FIG. 1 are combined by the combining circuit 2, and, as a result, the quantization noise can be reduced to a low level relative to that of the main signal. However, a quantization noise remains in the signal outputted from the combining circuit 2.

Figure 5:
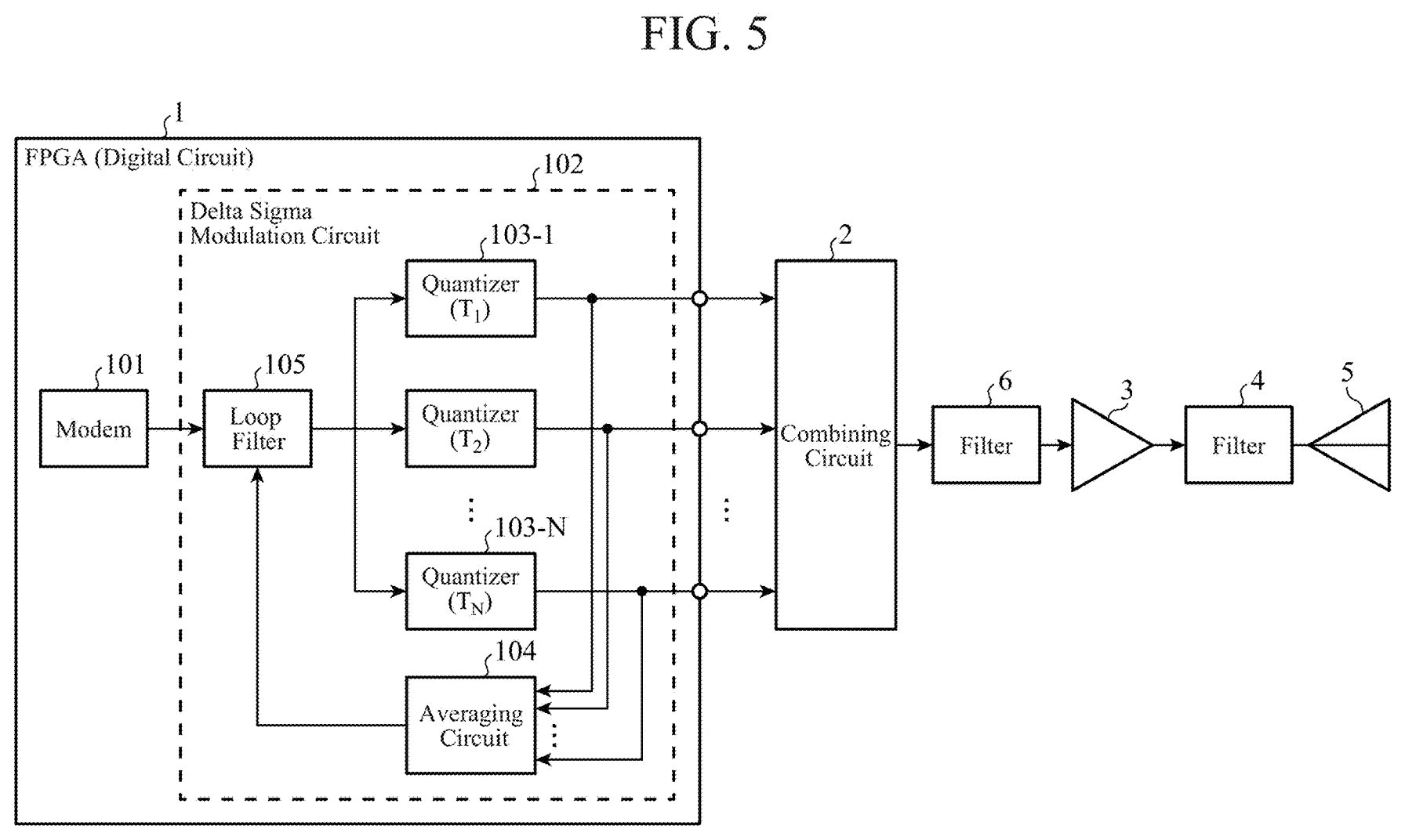

Accordingly, in the digital transmitter according to Embodiment 1, a filter 6 may be connected between the combining circuit 2 and the amplifier 3, for example, as shown in FIG. 5.

This filter 6 allows the main signal included in the signal after the combining by the combining circuit 2 to pass therethrough, and removes the quantization noise existing in a band in the vicinity of that of the main signal. As this filter 6, a bandpass filter or a low pass filter can be used.

In the digital transmitter according to Embodiment 1, the quantization noise left in the signal outputted from the combining circuit 2 can be removed by means of this filter 6, and the SNR of the transmission signal can be further improved.

In FIG. 5, the example in which the filter 6 is connected between the combining circuit 2 and the amplifier 3 is shown. However, this embodiment is not limited to this example, and the filter 6 may be connected between the amplifier 3 and the filter 4 or between the filter 4 and the antenna 5.

Figure 6:
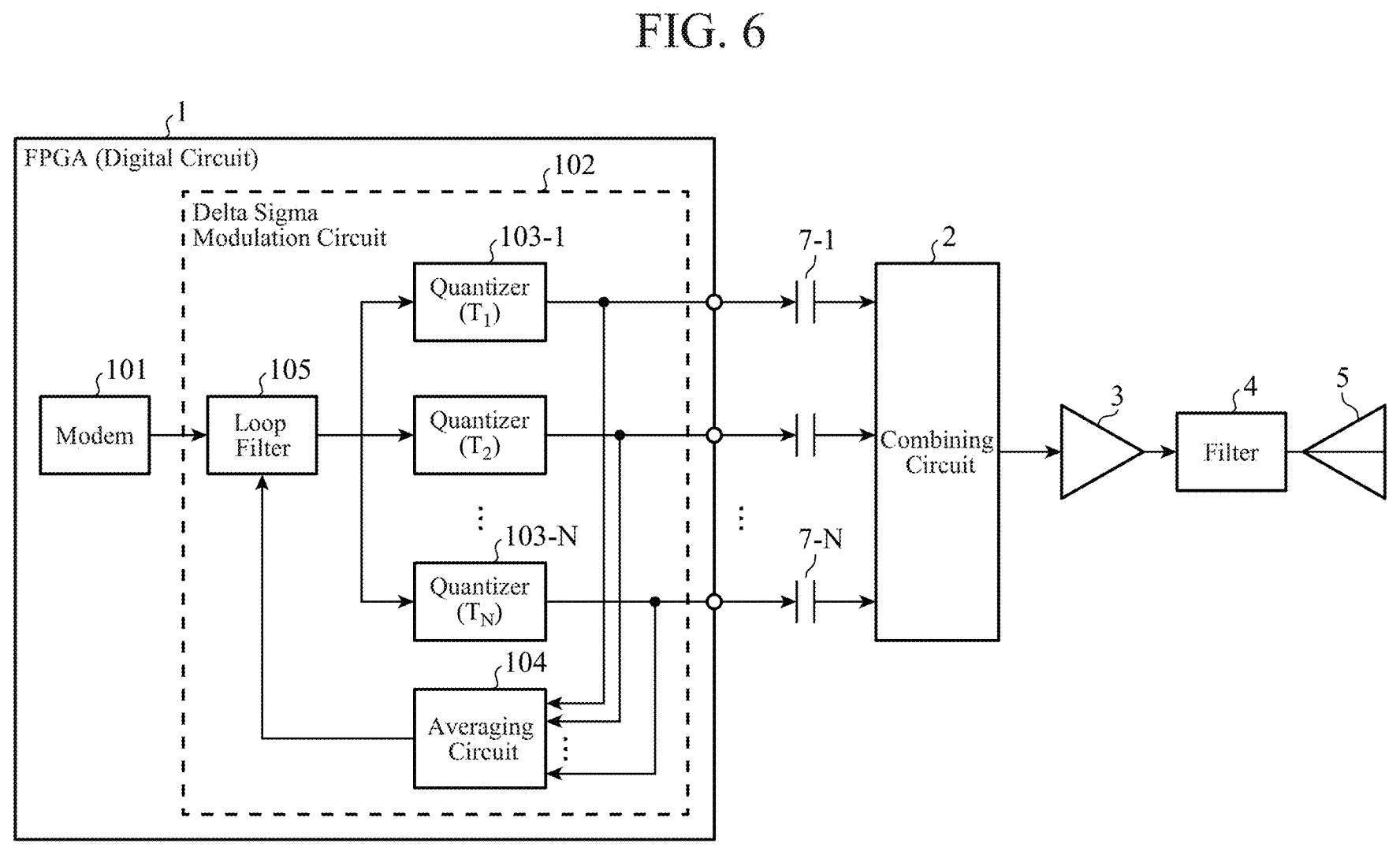

Further, in FIG. 1, the configuration in which the combining circuit 2 is connected directly as a stage following the FPGA 1 is shown. However, this embodiment is not limited to this example, and DC blocks 7-1 to 7-N may be connected between the FPGA 1 and the combining circuit 2, for example, as shown in FIG. 6.

Each of the DC blocks 7-1 to 7-N allows a high frequency signal to pass therethrough, but prevents the passage of a direct current. As these DC blocks 7-1 to 7-N, capacitors, high pass filters, or the likes can be used. In FIG. 6, the case in which capacitors are used as the DC blocks 7-1 to 7-N is shown.

Here, each of the 1-bit signals outputted from the FPGA 1 has a binary value of High (positive voltage) or Low (GND) and changes with time, and contains a DC component. Therefore, in the digital transmitter according to Embodiment 1, by inputting the 1-bit signals to the DC blocks 7-1 to 7-N, the signals can be combined after the DC component is removed from each of the signals.

Further, in the above explanation, the configuration in which the in-phase combining circuit 2a, typified by a Wilkinson combiner shown in FIG. 2A, is used as the combining circuit 2 is shown.

Figure 7:
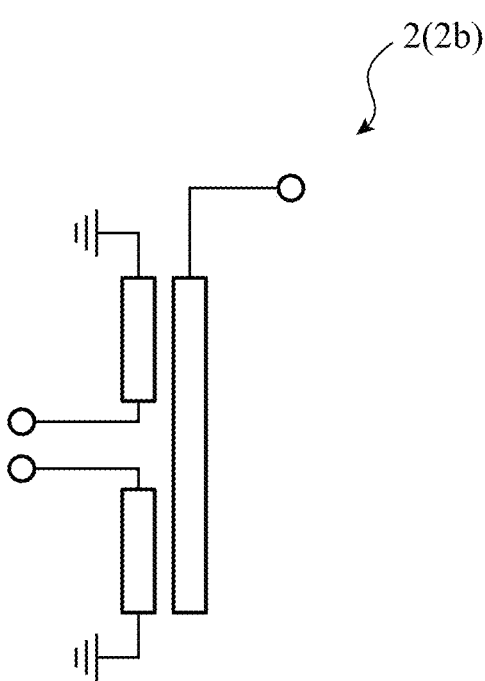
FIG. 7 is a diagram showing another example of the configuration of the combining circuit in Embodiment 1.

However, this embodiment is not limited to this example, and an inverse-phase combining circuit 2b, typified by a Marchand balun shown in FIG. 7, can also be used as the combining circuit 2. The Marchand balun shown in FIG. 7 includes a transmission line.

Figure 8:
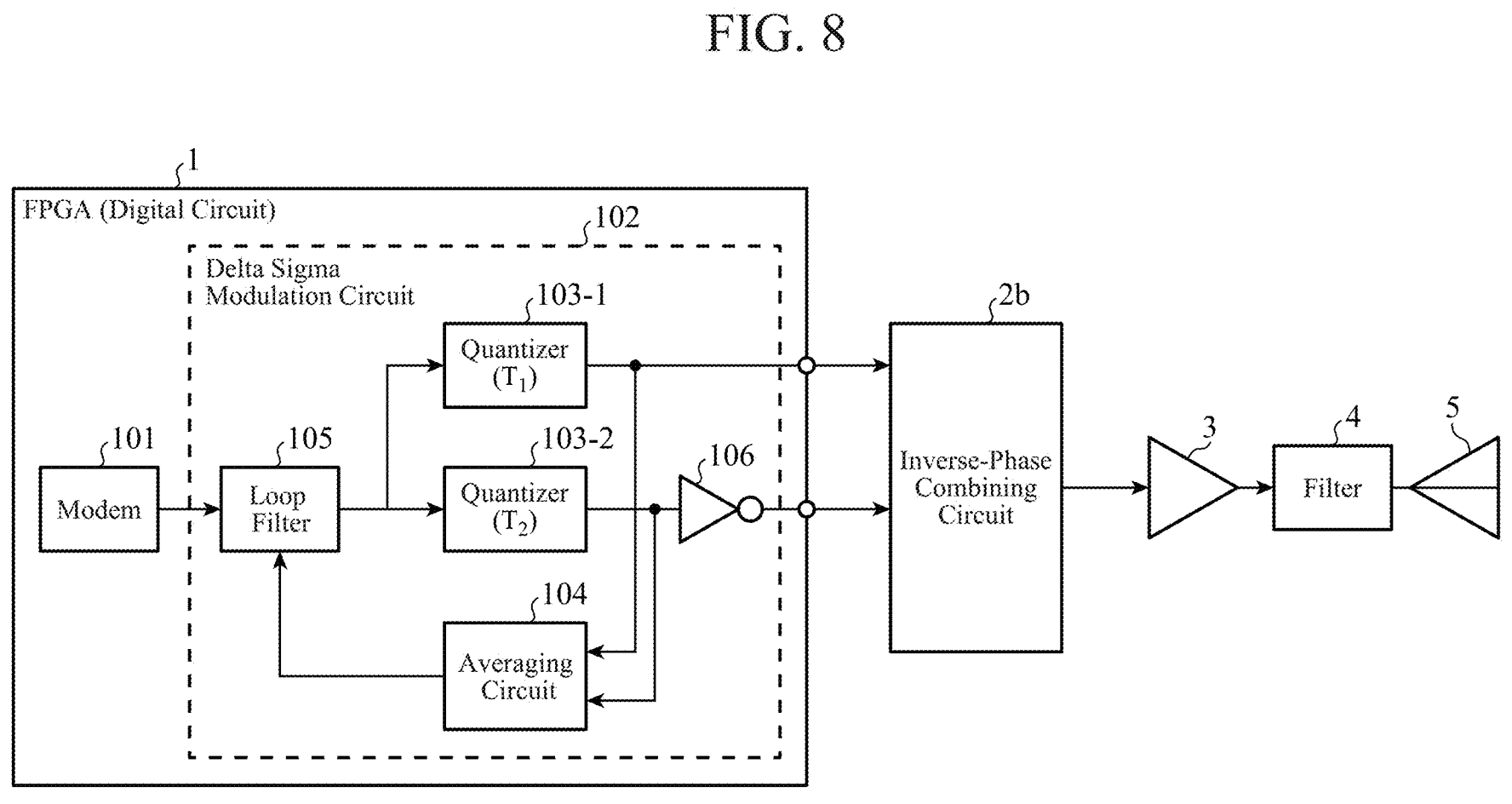

An example of the configuration of the digital transmitter in the case where the inverse-phase combining circuit 2b is used as the combining circuit 2 is shown in FIG. 8. In FIG. 8, for the sake of simplicity, although the case in which two quantizers are used as the quantizers 103-1 to 103-N is shown, this configuration can be implemented using an even number of quantizers.

In the digital transmitter shown in FIG. 8, an inverter 106 is additionally connected to the output of a quantizer 103-2 out of the two quantizers.

The inverter 106 inverts a 1-bit signal outputted by the quantizer 103-2. The signal after the inversion by this inverter 106 is outputted to the inverse-phase combining circuit 2b.

The inverse-phase combining circuit 2b then inverts the signal after the inversion by the inverter 106 again, and performs combining on the amplitude of the signal outputted by the quantizer 103-1. Therefore, in the configuration shown in FIG. 5, the same advantageous effect as that provided by the configuration shown in FIG. 1 is provided as a result.

In FIG. 8, the configuration in which the inverter 106 is connected as a stage following the quantizer 103-2 is shown. However, this embodiment is not limited to this example, and what is necessary is just to provide a configuration in which the output signals from the quantizers (quantizers 103-1 and 103-2) which are paired with each other have values which are the bit inverses of each other.

For example, the inverter 106 may be connected as a stage following the quantizer 103-1, instead of a stage following the quantizer 103-2.

Further, a quantizer which outputs a value which is bit-inverse to that of the quantizer 103-1 may be used as the quantizer 103-2, for example, without using the inverter 106. For example, as the quantizer 103-2, a quantizer which compares a preset threshold and the value shown by the signal after the digital processing by the loop filter 105, to output a signal showing 0 when the value shown by the signal after the digital processing is greater than or equal to the threshold, or output a signal showing 1 when the value shown by the signal after the digital processing is less than the threshold may be used.

As mentioned above, according to this Embodiment 1, the delta sigma modulation circuit 102 includes: the loop filter 105 to perform the digital processing on a signal inputted from the outside; the multiple quantizers 103-1 to 103-N to output 1-bit signals corresponding to magnitude relationships with the thresholds on the basis of the signal after the digital processing by the loop filter 105; and the averaging circuit 104 to calculate the average of the values shown by the signals outputted by the quantizers 103-1 to 103-N, and to feed back the average to the loop filter 105, and the thresholds used by the quantizers 103-1 to 103-N differ from one another. As a result, the delta sigma modulation circuit 102 according to Embodiment 1 can generate multiple signals which make it possible to reduce a quantization noise relative to a main signal, with the single configuration.

Further, according to this Embodiment 1, the digital transmitter includes: the modem 101 to generate a signal which is a transmission object; the loop filter 105 to perform the digital processing on the signal generated by the modem 101; the multiple quantizers 103-1 to 103-N to output 1-bit signals corresponding to magnitude relationships with the thresholds on the basis of the signal after the digital processing by the loop filter 105; the averaging circuit 104 to calculate the average of the values shown by the signals outputted by the quantizers 103-1 to 103-N, and to feed back the average to the loop filter 105; the combining circuit 2 to combine the amplitudes of the signals outputted by the quantizers 103-1 to 103-N; the amplifier 3 to amplify the power of the signal after the combining by the combining circuit 2; and the antenna 5 to emit the signal after the amplification by the amplifier 3, as an electric wave, into space, and the thresholds used by the quantizers 103-1 to

103-N differ from one another. As a result, the digital transmitter according to Embodiment 1 makes it possible to improve the SNR of the transmission signal while preventing an increase in the circuit scale of the FPGA 1, and makes it possible to achieve a downsizing and a cost reduction thereof, as compared with conventional digital transmitters.

Embodiment 2

In Embodiment 2, an example of the configuration in the case where the digital transmitter shown in Embodiment 1 is applied to an array antenna is shown.

Figure 9:
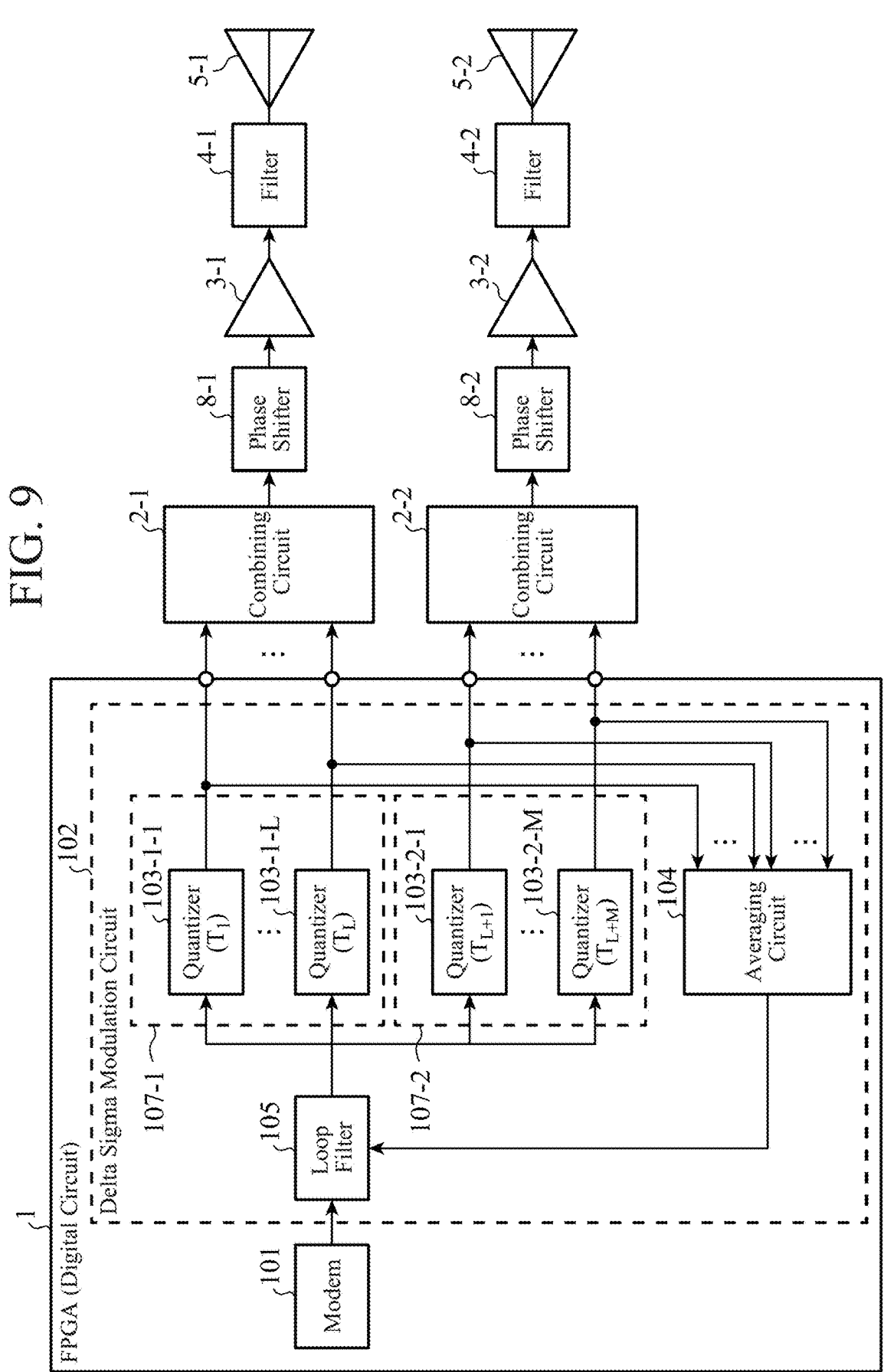
FIG. 9 is a diagram showing an example of the configuration of a digital transmitter according to Embodiment 2.

A digital transmitter according to the Embodiment 2 shown in FIG. 9 is one in which, when compared with the digital transmitter according to Embodiment 1 shown in FIG. 1, the quantizers 103-1 to 103-N are changed to multiple quantizer groups 107-K (quantizers 103-1-1 to 103-1-L, and quantizers 103-2-1 to 103-2-M), the combining circuit 2 is changed to multiple combining circuits 2-K (a combining circuit 2-1 and a combining circuit 2-2), the amplifier 3 is changed to multiple amplifiers 3-K (an amplifier 3-1 and an amplifier 3-2), the filter 4 is changed to multiple filters 4-K (a filter 4-1 and a filter 4-2), the antenna 5 is changed to multiple antennas 5-K (an antenna 5-1 and an antenna 5-2), and multiple phase shifters 8-K (a phase shifter 8-1 and a phase shifter 8-2) are added. An example of the configuration of the other components in the digital transmitter according to Embodiment 2 shown in FIG. 9 is the same as that of the digital transmitter according to the Embodiment 1 shown in FIG. 1, and the other components are denoted by the same reference signs and an explanation of the other components will be omitted.

In FIG. 9, for the sake of simplicity, although the case of K=2 is shown, K may be greater than or equal to three.

Each of the quantizers 103-1-1 to 103-1-L converts a signal after digital processing by a loop filter 105 into a 1-bit signal. Each of signals after the conversion by these quantizers 103-1-1 to 103-1-L is outputted to an averaging circuit 104 and the combining circuit 2-1.

More concretely, each of the quantizers 103-1-1 to 103-1-L compares a preset threshold and the value shown by the signal after the digital processing by the loop filter 105, and outputs a 1-bit signal corresponding to a magnitude relationship between them.

For example, each of the quantizers 103-1-1 to 103-1-L outputs a signal showing 1 when the value shown by the signal after the above-mentioned digital processing is greater than or equal to the threshold, or outputs a signal showing 0 when the value shown by the signal after the above-mentioned digital processing is less than the threshold.

The thresholds used by the quantizers 103-1-1 to 103-1-L differ from one another. For example, the thresholds used by the quantizers 103-1-1 to 103-1-L may be set to equally spaced values.

Each of the quantizers 103-2-1 to 103-2-M converts the signal after the digital processing by the loop filter 105 into a 1-bit signal. Each of signals after the conversion by these quantizers 103-2-1 to 103-2-M is outputted to the averaging circuit 104 and the combining circuit 2-2.

More concretely, each of the quantizers 103-2-1 to 103-2-M compares a preset threshold and the value shown by the signal after the digital processing by the loop filter 105, and outputs a 1-bit signal corresponding to a magnitude relationship between them.

For example, each of the quantizers 103-2-1 to 103-2-M outputs a signal showing 1 when the value shown by the signal after the above-mentioned digital processing is greater than or equal to the threshold, or outputs a signal showing 0 when the value shown by the signal after the above-mentioned digital processing is less than the threshold.

The thresholds used by the quantizers 103-2-1 to 103-2-M differ from one another. For example, the thresholds used by the quantizers 103-2-1 to 103-2-M may be set to equally spaced values.

An identical set of thresholds may be set to both the quantizers 103-1-1 to 103-1-L and the quantizers 103-2-1 to 103-2-M, or different sets of thresholds may be set to the quantizers 103-1-1 to 103-1-L and the quantizers 103-2-1 to 103-2-M.

Further, L and M may be the same number, or may be different numbers.

On the basis of the 1-bit signals outputted by the quantizers 103-1-1 to 103-1-L and the 1-bit signals outputted by the quantizers 103-2-1 to 103-2-M, the averaging circuit 104 in Embodiment 2 calculates the average of the values shown by these signals. A signal showing the average calculated by this averaging circuit 104 is fed back to the loop filter 105.

The combining circuit 2-1 combines the amplitudes of the 1-bit signals outputted by the quantizers 103-1-1 to 103-1-L, out of the multiple 1-bit signals outputted by an FPGA 1. A signal after the combining by this combining circuit 2-1 is outputted to the amplifier 3-1.

As this combining circuit 2-1, a combining circuit which includes an analog passive circuit is used.

The combining circuit 2-2 combines the amplitudes of the 1-bit signals outputted by the quantizers 103-2-1 to 103-2-M, out of the multiple 1-bit signals outputted by the FPGA 1. A signal after the combining by this combining circuit 2-2 is outputted to the amplifier 3-2.

As this combining circuit 2-2, a combining circuit which includes an analog passive circuit is used.

The phase shifter 8-1 changes the phase of the signal after the combining by the combining circuit 2-1. More specifically, the phase shifter 8-1 rotates the phase of the signal after the combining by the combining circuit 2-1 on the basis of a setting made by a control circuit (not shown) disposed in the digital transmitter/receiver. The signal after the change of the phase by this phase shifter 8-1 is outputted to the amplifier 3-1. The phase shifter 8-2 changes the phase of the signal after the combining by the combining circuit 2-2. More specifically, the phase shifter 8-2 rotates the phase of the signal after the combining by the combining circuit 2-2 on the basis of the setting made by the control circuit (not shown) disposed in the digital transmitter/receiver. The signal after the change of the phase by this phase shifter 8-2 is outputted to the amplifier 3-2.

The amplifier 3-1 amplifies the power of the signal after the combining by the combining circuit 2-1. The signal after the amplification by this amplifier 3-1 is outputted to the filter 4-1.

As this amplifier 3-1, an amplifier which uses a semiconductor such as a CMOS is used, for example.

The amplifier 3-2 amplifies the power of the signal after the combining by the combining circuit 2-2. The signal after the amplification by this amplifier 3-2 is outputted to the filter 4-2.

As this amplifier 3-2, an amplifier which uses a semiconductor such as a CMOS is used, for example.

The filter 4-1 removes higher harmonics included in the signal after the amplification by the amplifier 3-1. The signal after the removal of higher harmonics by this filter 4-1 is outputted to the antenna 5-1.

As this filter 4-1, a low pass filter is used, for example.

This filter 4-1 is not a component indispensable to the digital transmitter.

The filter 4-2 removes higher harmonics included in the signal after the amplification by the amplifier 3-2. The signal after the removal of higher harmonics by this filter 4-2 is outputted to the antenna 5-2.

As this filter 4-2, a low pass filter is used, for example.

This filter 4-2 is not a component indispensable to the digital transmitter.

The antenna 5-1 emits the signal after the removal of higher harmonics by the filter 4-1, as an electric wave, into space.

As this antenna 5-1, a patch antenna is used, for example.

The antenna 5-2 emits the signal after the removal of higher harmonics by the filter 4-2, as an electric wave, into space.

As this antenna 5-2, a patch antenna is used, for example.

Next, an example of the operation of the digital transmitter according to Embodiment 2 shown in FIG. 9 will be explained. In the digital transmitter according to Embodiment 2 shown in FIG. 9, when a signal generated by a modem 101 is inputted to the loop filter 105, digital processing is performed on between the signal and the output of the averaging circuit 104, and a result is outputted to the quantizers 103-1-1 to 103-1-L and the quantizers 103-2-1 to 103-2-M. Within the loop filter 105, an adder 1051 calculates the difference between the signal generated by the modem 101 and a signal which a delay unit 1053 outputs by delaying the output of the averaging circuit 104 by one clock, and an adder 1052 and a delay unit 1054 perform addition on the signal showing the difference.

Further, the thresholds ($T_1$ to $T_L$) different from one another are set to the quantizers 103-1-1 to 103-1-L. Then, these quantizers 103-1-1 to 103-1-L output 1-bit signals which they acquire from the signal from the loop filter 105, respectively, on the basis of the thresholds ($T_1$ to $T_L$).

Similarly, the thresholds ($T_{L+1}$ to $T_{L+M}$) different from one another are set to the quantizers 103-2-1 to 103-2-M. Then, these quantizers 103-2-1 to 103-2-M output 1-bit signals which they acquire from the signal from the loop filter 105, respectively, on the basis of the thresholds ($T_{L+1}$ to $T_{L+M}$).

The 1-bit signals outputted from the quantizers 103-1-1 to 103-1-L and the quantizers 103-2-1 to 103-2-M are then inputted to the averaging circuit 104 and an average is calculated by the averaging circuit 104, and, after that, the average is fed back to the loop filter 105.

Then, a delta sigma modulation circuit 102 repeatedly performs the above-mentioned operation.

Each of the 1-bit signals outputted from the quantizers 103-1-1 to 103-1-L is expressed by High and Low, and the amplitudes of the 1-bit signals are combined by the combining circuit 2-1.

Similarly, each of the 1-bit signals outputted from the quantizers 103-2-1 to 103-2-M is expressed by High and Low, and the amplitudes of the 1-bit signals are combined by the combining circuit 2-2.

Then, as a result of combining the amplitudes of the L 1-bit signals outputted from the FPGA 1 in the combining circuit 2-1, a stair-like output in which the number of steps is L is acquired. In this output, a quantization error occurring between the signal which is a transmission object and a signal outputted from the combining circuit 2-1 is small, by an amount corresponding to L which is the number of steps, compared with that in the configuration of FIG. 11 which corresponds to the case in which the number of steps is 1. Therefore, the spectrum of the signal outputted from the combining circuit 2-1 has a quantization noise whose level is low relatively to that of a main signal, and the SNR is improved.

Similarly, as a result of combining the amplitudes of the M 1-bit signals outputted from the FPGA 1 in the combining circuit 2-2, a stair-like output in which the number of steps is M is acquired. In this output, a quantization error occurring between the signal which is a transmission object and a signal outputted from the combining circuit 2-2 is small, by an amount corresponding to M which is the number of steps, compared with that in the configuration of FIG. 11 which corresponds to the case in which the number of steps is 1. Therefore, the spectrum of the signal outputted from the combining circuit 2-2 has a quantization noise whose level is low relatively to that of a main signal, and the SNR is improved.

After that, the phase of the signal after the combining by the combining circuit 2-1 is rotated by the phase shifter 8-1, the power of the signal is amplified by the amplifier 3-1, and higher harmonics occurring in the amplifier 3-1 are removed from the signal by the filter 4-1, and, after that, the signal is transmitted as an electric wave from the antenna 5-1.

Similarly, the phase of the signal after the combining by the combining circuit 2-2 is rotated by the phase shifter 8-2, the power of the signal is amplified by the amplifier 3-2, and higher harmonics occurring in the amplifier 3-2 are removed from the signal by the filter 4-2, and, after that, the signal is transmitted as an electric wave from the antenna 5-2.

In the electric waves transmitted from the antennas 5-1 and 5-2, the phases of the main signals differ from each other by the difference between the amounts of phase rotation set to the phase shifters 8-1 and 8-2.

When the electric waves transmitted from the antennas 5-1 and 5-2 are then combined in space, the direction in which the electric wave is transmitted is changed depending on the difference between the amounts of phase rotation set to the phase shifters 8-1 and 8-2.

As mentioned above, in the digital transmitter according to Embodiment 2, the multiple quantizers are divided into the multiple quantizer groups 107-K, the combining circuit 2-K, the amplifier 3-K, the filter 4-K, and the antenna 5-K are connected for each quantizer group 107-K, the phase shifter 8-K is further connected between the combining circuit 2-K and the amplifier 3-K, and a difference is provided between the amount of phase rotation set to each phase shifter 8-K. As a result, in the digital transmitter according to Embodiment 2, an advantageous effect of being able to change the direction of an electric wave transmitted from the digital transmitter is provided in addition to the advantageous effect shown in Embodiment 1.

In FIG. 9, the configuration in which the phase shifter 8-K is connected between the combining circuit 2-K and the amplifier 3-K is shown. However, this embodiment is not limited to this example, and the phase shifter 8-K may be connected between the amplifier 3-K and the filter 4-K or between the filter 4-K and the antenna 5-K.

Embodiment 3

In the digital transmitter according to Embodiment 1, the case in which the combining circuit 2 combines the signals outputted from the multiple quantizers 103-1 to 103-N is shown. On the other hand, in Embodiment 3, a configuration of performing space combining on signals outputted from multiple quantizers 103-1 to 103-N with the signals being in the form of electric waves emitted from an antenna 5, instead of using the combining circuit 2 shown in Embodiment 1, is shown.

Figure 10:
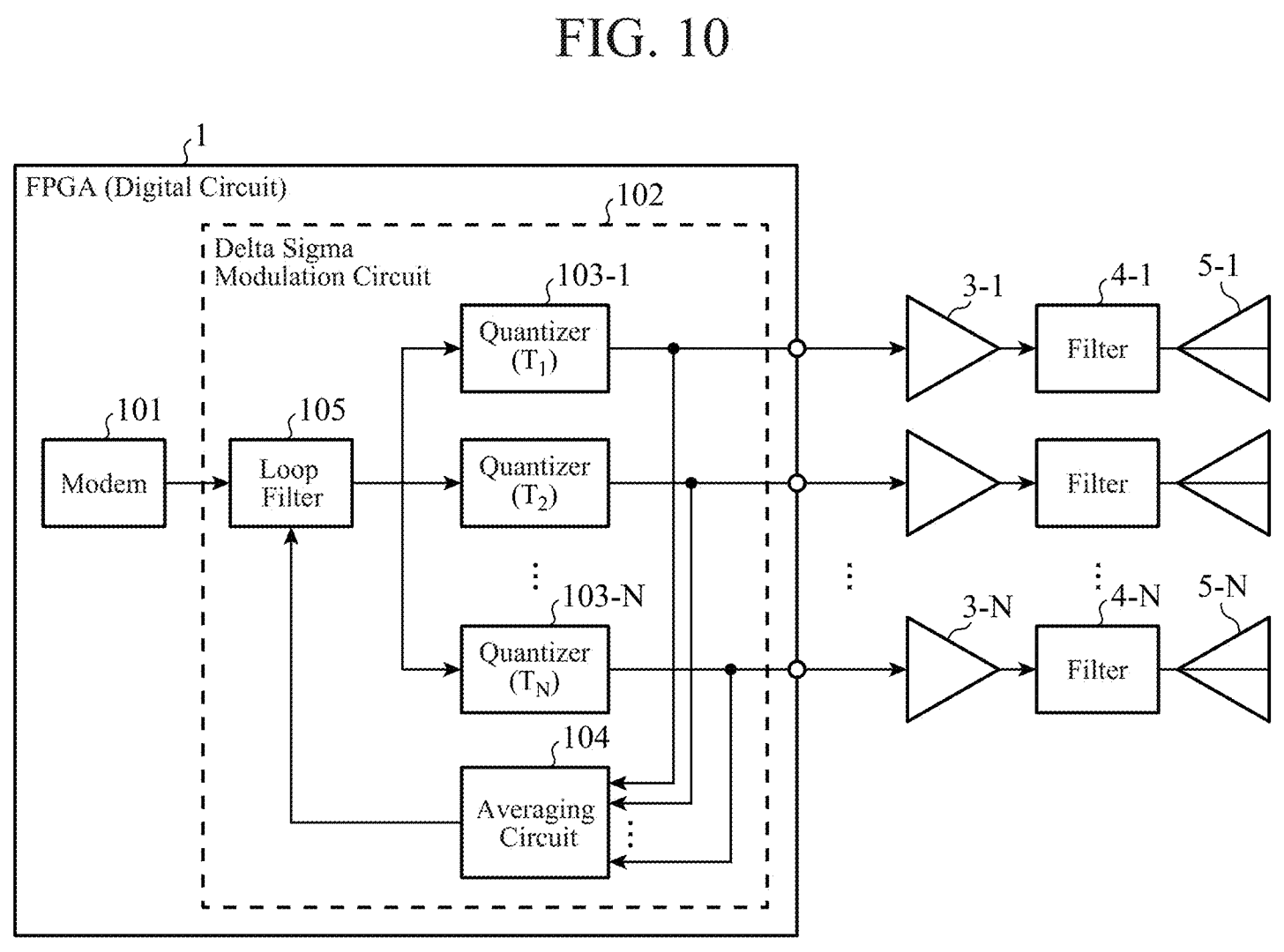

A digital transmitter according to Embodiment 2 shown in this FIG. 10 is one in which, when compared with the digital transmitter according to the Embodiment 1 shown in FIG. 1, the combining circuit 2 is removed, the amplifier 3 is changed to multiple amplifiers 3-1 to 3-N, the filter 4 is changed to multiple filters 4-1 to 4-N, and the antenna 5 is changed to multiple antennas 5-1 to 5-N. An example of the configuration of the other components in the digital transmitter according to Embodiment 3 shown in FIG. 10 is the same as that of the digital transmitter according to the Embodiment 1 shown in FIG. 1, and the other components are denoted by the same reference signs and an explanation of the other components will be omitted.

The amplifiers 3-1 to 3-N are connected, respectively, to the quantizers 103-1 to 103-N. These amplifiers 3-1 to 3-N amplify the power of multiple 1-bit signals outputted by the quantizers 103-1 to 103-N connected thereto, respectively. The signals after the amplification by these amplifiers 3-1 to 3-N are outputted to the filters 4-1 to 4-N connected to the amplifiers.

As these amplifiers 3-1 to 3-N, amplifiers using a semiconductor such as a CMOS are used, for example.

The filters 4-1 to 4-N are connected, respectively, to the amplifiers 3-1 to 3-N. These filters 4-1 to 4-N remove higher harmonics included in the signals after the amplification by the amplifiers 3-1 to 3-N connected thereto, respectively. The signals after the removal of higher harmonics by these filters 4-1 to 4-N are outputted to the antennas 5-1 to 5-N connected to the filters.

As these filters 4-1 to 4-N, low pass filters are used, for example.

These filters 4-1 to 4-N are not components indispensable to the digital transmitter.

The antennas 5-1 to 5-N are connected, respectively, to the filters 4-1 to 4-N. These antennas 5-1 to 5-N emit the signals after the removal of higher harmonics by the filters 4-1 to 4-N connected thereto, as electric waves, into space, respectively.

As these antennas 5-1 to 5-N, patch antennas are used, for example.

Then, the amplitudes of the signals emitted by the antennas 5-1 to 5-N are combined in space.

Next, an example of the operation of the digital transmitter according to Embodiment 3 shown in FIG. 10 will be explained.

In the digital transmitter according to Embodiment 3 shown in FIG. 10, when a signal generated by a modem 101 is inputted to a loop filter 105, digital processing is perform on between the signal and the output of an averaging circuit 104, and a result is outputted to the quantizers 103-1 to 103-N. Within the loop filter 105, an adder 1051 calculates the difference between the signal generated by the modem 101 and a signal which a delay unit 1053 outputs by delaying the output of the averaging circuit 104 by one clock, and an adder 1052 and a delay unit 1054 perform addition on the signal showing the difference.

Further, thresholds ($T_1$ to $T_N$) different from one another are set, respectively, to the quantizers 103-1 to 103-N. Then, these quantizers 103-1 to 103-N output 1-bit signals which they acquire from the signal from the loop filter 105, respectively, on the basis of the thresholds ($T_1$ to $T_N$).

The 1-bit signals outputted from the quantizers 103-1 to 103-N are then inputted to the averaging circuit 104 and the average of the values shown by the signals is calculated by the averaging circuit 104, and, after that, the average is fed back to the loop filter 105.

Then, a delta sigma modulation circuit 102 repeatedly performs the above-mentioned operation.

Each of the 1-bit signals outputted from the quantizers 103-1 to 103-N is expressed by High and Low.

After that, the power of the 1-bit signals outputted from an FPGA 1 is amplified by the amplifiers 3-1 to 3-N, higher harmonics occurring in the amplifiers 3-1 to 3-N are removed from the 1-bit signals by the filters 4-1 to 4-N, and, after that, the 1-bit signals are transmitted as electric waves from the antennas 5-1 to 5-N.

Then, the electric waves transmitted from the antennas 5-1 to 5-N are combined in space.

As a result of the combining in space of the electric waves transmitted from the antennas 5-1 to 5-N, a stair-like output in which the number of steps is N is acquired, like in the case where signals are combined by the combining circuit 2. In this output, a quantization error occurring between the signal which is a transmission object and a signal outputted from the combining circuit 2 is small, by an amount corresponding to N which is the number of steps, compared with that in the configuration of FIG. 11 which corresponds to the case in which the number of steps is 1. Therefore, the spectrum of the signal combined in space has a quantization noise whose level is low relatively to that of a main signal, and the SNR is improved.

As mentioned above, in the digital transmitter according to Embodiment 3, the amplifiers 3-1 to 3-N, the filters 4-1 to 4-N, and the antennas 5-1 to 5-N are connected, respectively, to the quantizers 103-1 to 103-N, and the electric waves transmitted from the antennas 5-1 to 5-N are combined in space. As a result, in the digital transmitter according to Embodiment 3, the combining circuit 2 can be made unnecessary, when compared with the digital transmitter according to Embodiment 1.

It is to be understood that an arbitrary combination of embodiments can be made, a change can be made in an arbitrary component of each of the embodiments, or an arbitrary component in each of the embodiments can be omitted.

INDUSTRIAL APPLICABILITY

The delta sigma modulation circuit according to the present disclosure can generate multiple signals which make it possible to reduce a quantization noise relative to a main signal, with a single configuration, and is suitable for use as a delta sigma modulation circuit to be mounted in a digital circuit, and so on.

REFERENCE SIGNS LIST

1: FPGA (Digital circuit), 2: Combining circuit, 2*a*: In-phase combining circuit, 2*b*: Inverse-phase combining circuit, 3: Amplifier, 4: filter, 5: Antenna, 6: Filter, 7: DC Block, 8: Phase shifter, 101: Modem, 102: Delta sigma modulation circuit, 103: Quantizer, 104: Averaging circuit, 105: Loop filter, 106: Inverter, 107:

Quantizer group, 1051: Adder, 1052: Adder, 1053: Delay unit, and 1054: Delay unit.

The invention claimed is:

1. A delta sigma modulation circuit comprising:

a loop filter to perform digital processing on a signal inputted from an outside;

multiple quantizers to output 1-bit signals corresponding to magnitude relationships with thresholds on a basis of the signal after the digital processing by the loop filter; and an averaging circuit to calculate an average of the signals respectively outputted by the quantizers, and to feed back the average to the loop filter, wherein the thresholds used by the quantizers differ from one another.

2. The delta sigma modulation circuit according to claim 1, wherein the thresholds used by the quantizers are set to equally spaced values.

3. A digital transmission circuit comprising:

a loop filter to perform digital processing on a signal inputted from an outside;

multiple quantizers to output 1-bit signals corresponding to magnitude relationships with thresholds on a basis of the signal after the digital processing by the loop filter;

an averaging circuit to calculate an average of the signals respectively outputted by the quantizers, and to feed back the average to the loop filter; and a combining circuit to combine amplitudes of the signals outputted by the quantizers, wherein the thresholds used by the quantizers differ from one another.

4. The digital transmission circuit according to claim 3, wherein the thresholds used by the quantizers are set to equally spaced values.

5. A digital transmitter comprising:

a modem to generate a signal which is a transmission object;

a loop filter to perform digital processing on the signal generated by the modem;

multiple quantizers to output 1-bit signals corresponding to magnitude relationships with thresholds on a basis of the signal after the digital processing by the loop filter;

an averaging circuit to calculate an average of the signals respectively outputted by the quantizers, and to feed back the average to the loop filter;

a combining circuit to combine amplitudes of the signals outputted by the quantizers;

an amplifier to amplify power of a signal after the combining by the combining circuit; and an antenna to emit the signal after the amplification by the amplifier, as an electric wave, into space, wherein the thresholds used by the quantizers differ from one another.

6. The digital transmitter according to claim 5, wherein the combining circuit includes an analog passive circuit.

7. The digital transmitter according to claim 5, wherein the thresholds used by the quantizers are set to equally spaced values.

\* \* \* \* \*